United States Patent [19]
Sardella et al.

[11] Patent Number: 6,010,959
[45] Date of Patent: Jan. 4, 2000

[54] METHOD OF IMPROVING PHOTORESIST ADHESION ON A DIELECTRIC LAYER

[75] Inventors: John C. Sardella, Highland Village; Alexander Kalnitsky; Charles R. Spinner, III, both of Dallas; Robert Carlton Foulks, Sr., Hurst, all of Tex.

[73] Assignee: STMicroelectronics, Inc., Carrollton, Tex.

[21] Appl. No.: 09/152,729

[22] Filed: Sep. 14, 1998

Related U.S. Application Data

[62] Division of application No. 08/905,918, Aug. 4, 1997, Pat. No. 5,877,541, which is a division of application No. 08/828,608, Jan. 31, 1992, Pat. No. 5,424,570.

[51] Int. Cl.$^7$ .................. H01L 29/34; B44C 1/22
[52] U.S. Cl. ................ 438/638; 438/640; 438/760
[58] Field of Search .................... 257/333; 438/640, 438/438, 436, 760, 637, 638

[56] References Cited

U.S. PATENT DOCUMENTS

| | | | |
|---|---|---|---|
| 3,837,071 | 9/1974 | Ronen | 29/571 |
| 4,152,824 | 5/1979 | Gonsiorawski | 29/572 |
| 4,349,584 | 9/1982 | Flatley et al. | 427/85 |
| 4,363,830 | 12/1982 | Hsu et al. | 427/88 |
| 4,818,335 | 4/1989 | Karnett | 156/644 |
| 4,902,377 | 2/1990 | Berglund et al. | 156/643 |
| 5,082,801 | 1/1992 | Nagata | 438/190 |
| 5,087,958 | 2/1992 | Chen et al. | 357/51 |
| 5,094,984 | 3/1992 | Liu et al. | 438/235 |
| 5,114,530 | 5/1992 | Rao et al. | 156/653 |
| 5,117,273 | 5/1992 | Stark et al. | 357/54 |
| 5,151,376 | 9/1992 | Spinner, III | 438/47 |
| 5,217,566 | 6/1993 | Pasch et al. | 156/636 |

*Primary Examiner*—Carl Whitehead, Jr.
*Assistant Examiner*—Kurt Eaton
*Attorney, Agent, or Firm*—Theodore E. Galanthay; Lisa K. Jorgenson; Dan Venglarik

[57] ABSTRACT

A method is provided for improving the adhesion between a photoresist layer and a dielectric, and an integrated circuit formed according to the same. A conformal dielectric layer is formed over the integrated circuit. An interlevel dielectric layer is formed over the conformal dielectric layer. The interlevel dielectric layer is doped such that the doping concentration allows the layer to reflow while partially inhibiting the adhesion of the doped layer to photoresist at an upper surface of the doped layer. An undoped dielectric layer is formed over the doped dielectric layer. A photoresist layer is formed and patterned over the undoped dielectric layer which adheres to the undoped dielectric layer. The undoped dielectric, the interlevel dielectric and the conformal dielectric layers are etched to form an opening exposing a portion of an underlying conductive region.

14 Claims, 1 Drawing Sheet

METHOD OF IMPROVING PHOTORESIST ADHESION ON A DIELECTRIC LAYER

This is a division of application Ser. No. 08/905,918, filed Aug. 4, 1997, U.S. Pat. No. 5,877,541, which is a division of application Ser. No. 08/828,608, filed Jan. 31, 1992, U.S. Pat. No. 5,424,570.

FIELD OF THE INVENTION

The present invention relates generally to semiconductor integrated circuit processing, and more specifically to improving photoresist adhesion on a dielectric layer.

BACKGROUND OF THE INVENTION

Insulators or dielectrics have widespread use in semiconductor processing. Silicon dioxide films are best known for their use as passivation to provide physical and chemical protection to the underlying devices and components. Silicon nitride films have also been widely used as a passivation layer providing additional scratch protection due in part to its hardness. The role of silicon dioxide films in processing has expanded. Deposited silicon dioxide films are now used as interlevel dielectrics between polysilicon and metal lines, as isolation films, as dopant barriers and as diffusion sources.

Deposited silicon dioxide films have a different physical structure from thermally grown oxide films. Depending on the deposition temperature, the silicon dioxide may have, among others, a different density, dielectric strength and etch rate. The addition of dopants to deposited silicon dioxide films may change the chemical and physical properties of the films. Deposited silicon dioxide films may also undergo a process called densification. The deposition of films was started to allow for a low-temperature deposition to occur preventing undesirable redistribution of impurities in the underlying regions during the processing steps. The densification of the silicon dioxide after deposition forms a film with physical and chemical properties approximating that of thermally grown oxide films.

There are several benefits of adding dopants to the silicon dioxide films. The moisture barrier properties of the films increase. Contaminants are prevented from entering the underlying layers and the viscosity of the films increase. This last benefit of increasing the flow property enhances the planarization of the surface of the film. Typically, boron and phosphorous are added to the silicon dioxide to enhance the flow property. The resultant film is known as borophosphorous silicate glass (BPSG).

As the concentration of dopants increases in the glass film, the temperature at which the film will reflow decreases. The lower processing temperature to cause reflow will not effect the electrical performance of the devices and components. As additional dopants are added, however, the surface of the glass layer becomes dopant rich. This increased concentration at the surface causes adhesion problems during subsequent contact patterning processes. In other words, the ability of photoresist to adequately adhere to the doped glass layer is significantly reduced. After the photoresist is formed over the glass layer and patterned, the opening formed in the photoresist is cleaned to remove any remaining photoresist residue in the areas where a contact is to be etched. This process, called descuming, enhances the photoresist's ability to adhere to the underlying glass layer. However, during the process of cleaning, a portion of the sidewalls of the photoresist is also removed. The removal of any of the photoresist along the sidewalls is becoming unacceptable in the submicron geometries.

It would be desirable to provide a technique which increases the adhesion of photoresist to the underlying dielectric layer. It would further be desirable for such a technique to be easily adapted for use with standard integrated circuit fabrication process flows without increasing the complexity of the process.

SUMMARY OF THE INVENTION

The invention may be incorporated into a method for forming a semiconductor device structure, and the semiconductor device structure formed thereby, by forming a first dielectric layer over the integrated circuit wherein the dielectric layer has a dopant concentration at an upper surface sufficient enough to allow the layer to be reflowed while partially inhibiting adhesion of the layer to photoresist at the upper surface. A second undoped dielectric layer is formed over the first dielectric layer. An opening is formed in the first and second dielectric layers exposing a portion of an underlying conductive structure wherein a portion of the dielectric layers has outwardly sloping sidewalls at the opening.

BRIEF DESCRIPTION OF THE DRAWINGS

The novel features believed characteristic of the invention are set forth in the appended claims. The invention itself, however, as well as a preferred mode of use, and further objects and advantages thereof, will best be understood by reference to the following detailed description of illustrative embodiments when read in conjunction with the accompanying drawings, wherein:

DETAILED DESCRIPTION OF THE PREFERRED EMBODIMENTS

The process steps and structures described below do not form a complete process flow for manufacturing integrated circuits. The present invention can be practiced in conjunction with integrated circuit fabrication techniques currently used in the art, and only so much of the commonly practiced process steps are included as are necessary for an understanding of the present invention. The figures representing cross-sections of portions of an integrated circuit during fabrication are not drawn to scale, but instead are drawn so as to illustrate the important features of the invention.

Figure 1:
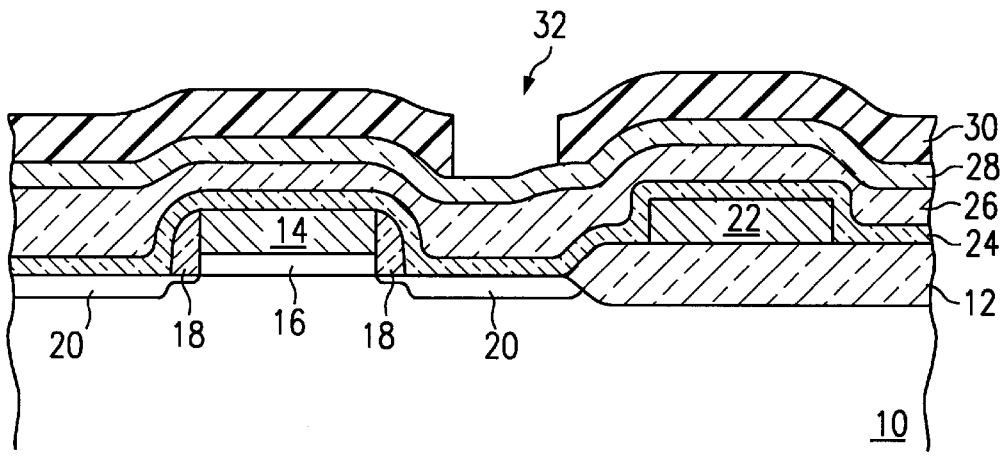
FIGS. 1–3 are cross-sectional views of the fabrication of a semiconductor device structure according to the present invention.

Referring to FIG. 1, an integrated circuit device is to be formed on a silicon substrate 10. A field oxide region 12 is formed on the substrate to separate active areas. A conductive structure such as a transistor gate is formed on the substrate by known methods comprising gate electrode 14 disposed over a gate oxide 16. The transistor will also comprise oxide spacers 18 and source/drain regions 20. Another conductive structure 22, such as a polysilicon signal line, may be formed over the field oxide region 12.

A first conformal dielectric layer 24 is formed over the integrated circuit. Layer 24 may typically comprise an undoped oxide or a silicon nitride having a thickness between approximately 100 to 2000 angstroms. A second dielectric layer 26 is formed over the first dielectric layer. Layer 26 is typically a conformal BPSG layer having a thickness of between approximately 3000 to 8000 angstroms. The BPSG layer may be formed by chemical vapor deposition.

The BPSG layer 26 is then ref lowed to form a more planar surface. The BPSG layer will typically have a dopant concentration of 2–4 percent boron and 4–7 percent phosphorous. At this concentration, the BPSG layer will flow at a reasonably low temperature between approximately 850 to 900° C. However, at this concentration, the upper surface of the BPSG layer 26 will become dopant rich. Any photoresist applied to the BPSG layer at this stage would not adequately adhere to the BPSG. Therefore, a third conformal dielectric layer 28 is formed over the BPSG layer. Layer 28 is typically an oxide layer having a thickness of between approximately 50 to 300 angstroms. The etch rate of this oxide layer should be closely matched to that of the BPSG layer 26. A photoresist layer 30 is then spun onto the oxide layer 28 and patterned to form an opening 32 where a contact opening will be subsequently etched through the dielectric layers. The oxide layer 28 is undoped allowing the photoresist layer 30 to adequately adhere to the oxide.

Figure 2:
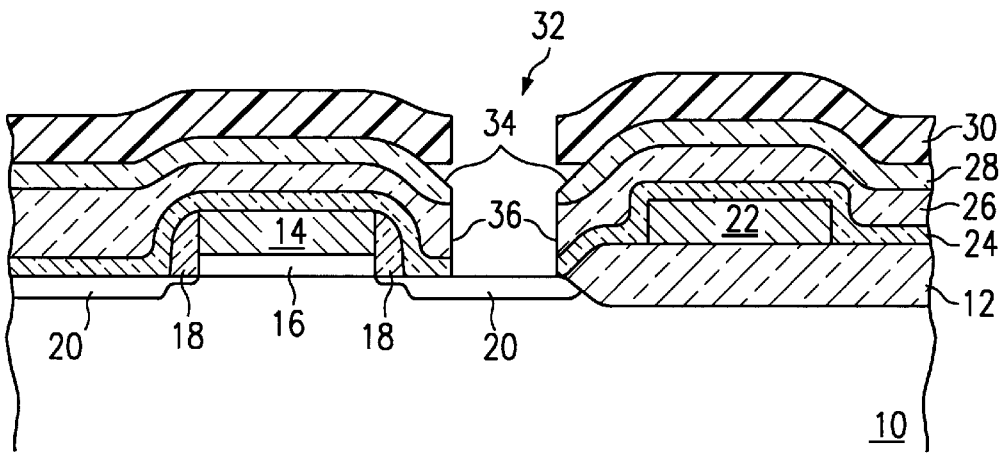

Referring to FIG. 2, the dielectric layers 24, 26 and 28 are etched in opening 32 to expose an underlying conductive structure such as the source/drain region 20 as shown in FIG. 2. The etch process is generally a wet etch followed by a dry etch. The wet etch is an isotropic etch which forms sloped sidewalls 34. The dry etch is an anisotropic etch which forms the vertical sidewalls 36. The undoped oxide layer 28 provides for adequate adhesion of the photoresist layer 30 to the oxide layer 28. This adhesion prevents unwanted undercutting of the upper portion o the dielectric layer 28 during the wet etch step. The contact opening thus remains relatively constant. Moreover, the undoped oxide layer 28 has substantially the same etch rate as the BPSG layer 26.

Figure 3:
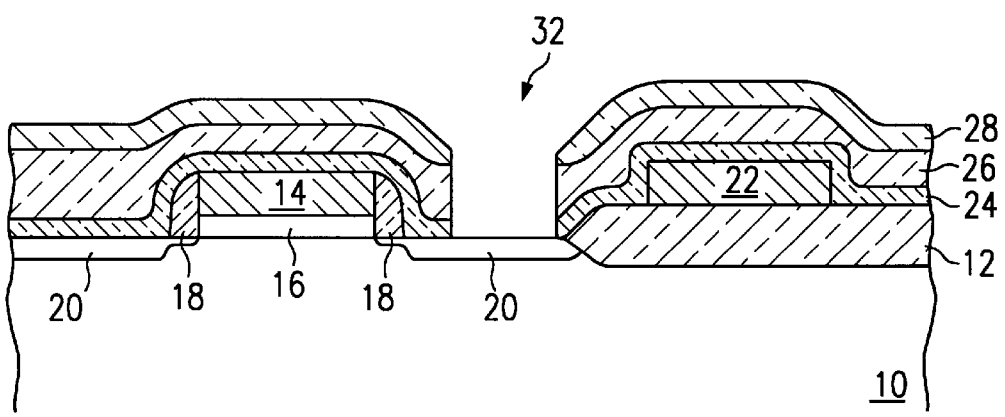

Referring to FIG. 3, the photoresist layer 30 is removed. the undoped oxide layer 28 does not have to be removed. Thus, at this stage, the complexity of the process is not increased. An alternative to the above process is to carry out the steps as described above up until the reflow of the BPSG layer 26. At this point, the BPSG layer is densified by a high temperature anneal process. The third dielectric layer 28 is then formed over the BPSG layer 26. The photoresist layer 30 is formed and patterned and the contact opening 32 is etched to expose the underlying conductive structure as described above. The reflow step is then performed to planarize the dielectric layers.

The thin undoped oxide layer 28 provides a medium for the photoresist layer to adhere to the interlevel dielectric to insure a higher quality contact opening. The oxide layer 28 does not need to be removed allowing this technique to be used with standard integrated circuit process flows.

As will be appreciated by those skilled in the art, the process steps described above can be used with nearly any conventional process flow. While the invention has been particularly shown and described with reference to a preferred embodiment, it will be understood by those skilled in the art that various changes in form and detail may be made therein without departing from the spirit and scope of the invention.

What is claimed is:

1. A method of forming a contact or via of an integrated circuit, comprising the steps of:

forming a first dielectric layer on the integrated circuit wherein the dielectric layer has a dopant concentration sufficient to allow the layer to be reflowed at a temperature between approximately 850° C. and 900° C., including approximately a 2–4% boron concentration and approximately a 4–7% phosphorus concentration; and forming a second undoped dielectric layer on the first dielectric layer;

forming and patterning a photoresist layer on the second undoped oxide layer; and forming an opening in the first and second dielectric layers exposing a portion of an underlying conductive structure wherein a portion of the dielectric layers has outwardly sloping sidewalls at the opening.

2. The method of claim 1, wherein the first dielectric layer comprises a BPSG layer disposed over a diffusion barrier layer.

3. The method of claim 2, wherein the diffusion barrier layer comprises an undoped oxide layer.

4. The method of claim 2, wherein the diffusion barrier layer comprises a silicon nitride layer.

5. The method of claim 1, wherein the second dielectric layer comprises an undoped oxide.

6. A method of improving the adhesion between a photoresist layer and a dielectric layer of an integrated circuit, comprising the steps of:

forming a conformal dielectric layer on the integrated circuit;

forming an interlevel dielectric layer on the conformal dielectric layer;

doping the interlevel dielectric layer wherein the doped layer has a doping concentration which allows the doped layer to reflow at a temperature of between approximately 850° C. and 900° C., including approximately a 2–4% boron concentration and approximately a 4–7% phosphorus concentration;

forming an undoped dielectric layer on the doped dielectric layer;

forming and patterning a photoresist layer on the undoped dielectric layer which adheres to the undoped dielectric layer; and etching an opening in the undoped dielectric, the interlevel dielectric and the conformal dielectric layers to expose a portion of an underlying conductive region.

7. The method of claim 6, further comprising the step of:

reflowing the interlevel dielectric layer before the undoped dielectric layer is formed.

8. The method of claim 6, further comprising the steps of:

densifying the interlevel dielectric layer before the undoped dielectric layer is formed; and reflowing the interlevel dielectric layer after the undoped dielectric layer is formed.

9. The method of claim 6, wherein the conformal dielectric layer comprises a diffusion barrier layer.

10. The method of claim 6, wherein the interlevel dielectric layer comprises BPSG.

11. The method of claim 6, wherein the undoped dielectric layer comprises oxide.

12. The method of claim 6, wherein the undoped dielectric layer has a thickness of between approximately 50 to 300 angstroms.

13. The method of claim 6, wherein the etching the dielectric layers step further comprises the step of:

partially isotropically etching the dielectric layers in the opening; and anisotropically etching the remaining portions of the dielectric layers in the opening exposing the underlying region.

14. The method of claim 13, wherein the isotropically etching step forms a sloped sidewall sloping outward toward an upper portion of the undoped dielectric layer.

* * * * *